United States Patent
Geffken et al.

(10) Patent No.: US 7,358,148 B2
(45) Date of Patent: Apr. 15, 2008

(54) ADJUSTABLE SELF-ALIGNED AIR GAP DIELECTRIC FOR LOW CAPACITANCE WIRING

(75) Inventors: Robert M. Geffken, Burlington, VT (US); William T. Motsiff, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 161 days.

(21) Appl. No.: 11/418,921

(22) Filed: May 5, 2006

(65) Prior Publication Data
US 2006/0202302 A1 Sep. 14, 2006

(51) Int. Cl.
*H01L 21/76* (2006.01)
(52) U.S. Cl. .................. 438/421; 438/422; 438/618; 438/619
(58) Field of Classification Search ........... 438/421, 438/422, 618, 619, 622, 627, 634, 637–639, 438/643, 672, 675; 257/E21.581, E21.262, 257/E21.251, E21.576
See application file for complete search history.

(56) References Cited

U.S. PATENT DOCUMENTS

| | | | |
|---|---|---|---|
| 5,117,276 A | 5/1992 | Thomas et al. | |
| 5,324,683 A | 6/1994 | Fitch et al. | |
| 5,444,015 A | 8/1995 | Aitken | |
| 5,510,645 A | 4/1996 | Fitch et al. | |
| 5,530,290 A | 6/1996 | Aitken | |
| 6,150,232 A | 11/2000 | Chan et al. | |
| 6,184,121 B1 | 2/2001 | Bushwalter | |
| 6,200,900 B1 | 3/2001 | Kitch | |
| 6,211,057 B1 | 4/2001 | Lin et al. | |
| 6,281,585 B1 | 8/2001 | Bothra | |
| 6,329,279 B1 | 12/2001 | Lee | |
| 6,333,255 B1 | 12/2001 | Sekiguchi | |
| 6,413,852 B1 | 7/2002 | Grill | |
| 6,423,629 B1 | 7/2002 | Ahn et al. | |
| 6,472,266 B1 | 10/2002 | Yu et al. | |
| 6,545,361 B2 | 4/2003 | Ueda et al. | |
| 6,812,113 B1 | 11/2004 | Alieu | |
| 6,838,354 B2 | 1/2005 | Goldberg et al. | |
| 2001/0023123 A1 | 9/2001 | Kim | |
| 2002/0127844 A1 | 9/2002 | Grill et al. | |
| 2004/0097065 A1 | 5/2004 | Lur et al. | |
| 2005/0079700 A1 | 4/2005 | Schindler | |

OTHER PUBLICATIONS

V. Arnal, J. Torres, P. Gayet, R. Gonella, P. Spinelli, M. Guillermet, J-P. Reynard, GC. Verove; *Integration of a 3 Level Cu-SiO2 Air Gap Interconnect for Sub 0.1 micron CMOS Technologies*; IEEE, Jun. 2001, pp. 298-300.

*Primary Examiner*—Thien F Tran
(74) *Attorney, Agent, or Firm*—DeLio & Peterson, LLC; Peter W. Peterson; Anthony Canale

(57) ABSTRACT

An adjustable self aligned low capacitance integrated circuit air gap structure comprises a first interconnect adjacent a second interconnect on an interconnect level, spacers formed along adjacent sides of the first and second interconnects, and an air gap formed between the first and second interconnects. The air gap extends above an upper surface of at least one of the first and second interconnects and below a lower surface of at least one of the first and second interconnects, and the distance between the spacers defines the width of the air gap. The air gap is self-aligned to the adjacent sides of the first and second interconnects.

4 Claims, 7 Drawing Sheets

ADJUSTABLE SELF-ALIGNED AIR GAP DIELECTRIC FOR LOW CAPACITANCE WIRING

BACKGROUND OF INVENTION

1. Field of the Invention

The present invention relates to semiconductor devices and, in particular, to an adjustable, self-aligned air gap dielectric for low capacitance wiring in semiconductor devices.

2. Description of Related Art

Because of continuing decreases in size of circuit components in semiconductor chips, there are a number of interconnect wiring challenges facing the technical community over the next few technology generations. Among these challenges is the problem of undesirable capacitance in dielectric materials between circuit wiring. One avenue being pursued to lower interconnect capacitance is by the use of porous dielectrics. However, because these materials generally have reduced mechanical strength and thermal conductivity, it is more difficult to build the chip and dissipate heat during chip operation. Another challenge in the next few technology generations is presented by the expectation that the resistivity of copper wiring will begin to rise as the wire line width starts to approach its electron mean free path. This resistivity rise is exacerbated by surface and interface roughness of the copper. Dual damascene trench and via sidewalls may also intersect the voids in adjacent porous dielectric areas and contribute to the copper resistivity rise.

An additional challenge expected by the 65 nm line width generation is that physical vapor deposition (PVD), or sputtered, barriers will need to be replaced with chemical vapor deposition (CVD) or atomic layer deposition (ALD) barriers to meet ongoing thickness reductions and improved conformality requirements. If the porous low k dielectric material used is an open cell type, i.e., with connected pores, then the CVD or ALD precursors can diffuse into the dielectric and degrade its low k characteristics. Also, depending upon the maximum pore size of the porous low k dielectric material, the thinner liners may not be able to provide continuous coverage to prevent copper diffusion into the adjacent dielectric material. For example, some current porous low k materials still have 200 Å max pore size when the barrier needs to be about 50 Å at the 65 nm technology node.

SUMMARY OF INVENTION

Bearing in mind the problems and deficiencies of the prior art, it is therefore an object of the present invention to provide a dielectric having low capacitance for use in a semiconductor device.

It is another object of the present invention to provide a low capacitance dielectric that does not provide problems with porosity as copper line widths decrease in semiconductor circuits.

A further object of the invention is to provide a low capacitance dielectric that does not contribute to rise of copper resistivity as copper line widths decrease in semiconductor circuits.

It is yet another object of the present invention to provide a low capacitance dielectric that is compatible with conductor liner deposition processes.

The above and other objects, which will be apparent to those skilled in art, are achieved in the present invention which is directed to an adjustable self aligned low capacitance integrated circuit air gap structure. In one aspect, the present invention provides a semiconductor device comprising a first interconnect adjacent a second interconnect on an interconnect level, spacers formed along adjacent sides of the first and second interconnects, and an air gap formed between the first and second interconnects. The air gap extends above an upper surface of at least one of the first and second interconnects and below a lower surface of at least one of the first and second interconnects, and the distance between the spacers defines the width of the air gap. The air gap may be self-aligned to the adjacent sides of the first and second interconnects.

The semiconductor device preferably further includes, beneath the at least one of the first and second interconnects, an etch stop layer positioned over an underlying via insulator level, such that the air gap extends below the lower surface of the at least one of the first and second interconnects by a distance corresponding to a thickness of the etch stop layer.

Preferably, the spacers adjacent the sides of the first and second interconnects comprise silicon dioxide or silicon nitride, the etch stop layer comprises silicon carbide, and the underlying via insulator level comprises silicon dioxide or fluorinated silicon dioxide.

The semiconductor device preferably includes at least one insulative layer above the interconnect level and the air gap, such that the air gap extends into the insulative layer. The at least one insulative layer above the interconnect level and the air gap may comprise silicon nitride or silicon carbon nitride as a capping layer for the interconnect and silicon dioxide or fluorinated silicon dioxide as an insulative layer above the capping layer.

The semiconductor device may further include silicon dioxide or silicon nitride hardmask spacers self-aligned to either side of an upper portion of the air gap, as well as an insulative layer above the interconnect level, the air gap and the hardmask spacers. The air gap extends between the hardmask spacers and upward into the insulative layer.

The first and second interconnects may be formed by a damascene or dual damascene process, and may comprise copper, aluminum, tungsten or gold. Over each of the first and second interconnects there may be a selective metal deposition layer comprising a selective tungsten layer or a selective cobalt tungsten phosphide layer.

The semiconductor device may further include, beneath one of the first and second interconnects, an etch stop layer positioned over at least one underlying via insulator level, and below the underlying via insulator, a second interconnect level. Between the at least one underlying via insulator level and the second interconnect level, there may be disposed a selective metal deposition layer comprising a selective tungsten layer or a selective cobalt tungsten phosphide layer.

In another aspect, the present invention provides a method for forming an air gap between a pair of interconnects on an interconnect level of a semiconductor device comprising depositing a plurality of insulative layers of a semiconductor device, depositing a first hardmask insulative layer over the plurality of insulative layers, and removing portions of the first hardmask insulative layer to expose regions of the uppermost of the plurality of insulative layers over which interconnects are to be formed, wherein the regions of over which interconnects are to be formed are spaced apart. The method then includes depositing a second hardmask insulator layer over the first hardmask layer and exposed regions of the uppermost of the plurality of insulative layers, and removing portions of the second hardmask insulative layer over the first hardmask insulative layer to expose regions of the uppermost of the plurality of insulative layers over which interconnects are to be formed. This leaves second hardmask spacers adjacent to the regions of the uppermost of the plurality of insulative layers over which interconnects are to be formed. The method further includes using the first hardmask insulative layer and second hardmask spacers to etch the at least one of the underlying plurality of insulative layers to form interconnect openings, depositing a conformal insulative layer to form spacers on sidewalls of the interconnect openings, and depositing conductive metal adjacent the conformal insulative layer spacers to form interconnects in the interconnect openings. The method then continues by etching portions of the first hardmask insulative layer and underlying plurality of insulative layers between the interconnects and conformal insulative layer spacers, and leaving second hardmask spacers adjacent to the interconnects and conformal insulative layer spacers, to form an air gap extending below at least one of the interconnects, and subsequently depositing at least one insulative layer over the air gap and over the interconnects and conformal insulative layer spacers to seal the air gap. Preferably, the air gap extends above the interconnects, into the at least one insulative layer.

The step of depositing plurality of insulative layers of a semiconductor device may comprise depositing a first insulative capping layer of a semiconductor device, depositing a second insulative layer over the first insulative capping layer, depositing a third insulative layer etch stop layer over the second insulative layer, and depositing a fourth insulative layer over the third insulative etch stop layer. In such case, the removing of portions of the first hardmask insulative layer exposes regions of the fourth insulative layer over which the interconnects are to be formed. This also results in etched portions of the first hardmask insulative layer, fourth insulative layer and third insulative etch stop layer between the interconnects and conformal insulative layer spacers, to leave the second hardmask spacers adjacent to the interconnects and conformal insulative layer spacers, and to form the air gap extending below at least one of the interconnects.

The at least one insulative layer over the interconnects may comprise a fifth insulative capping layer for the interconnect and a sixth insulative layer above the capping layer, such that the air gap extends completely through the fifth capping layer and into a portion of the sixth insulative layer.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

Figure 1:
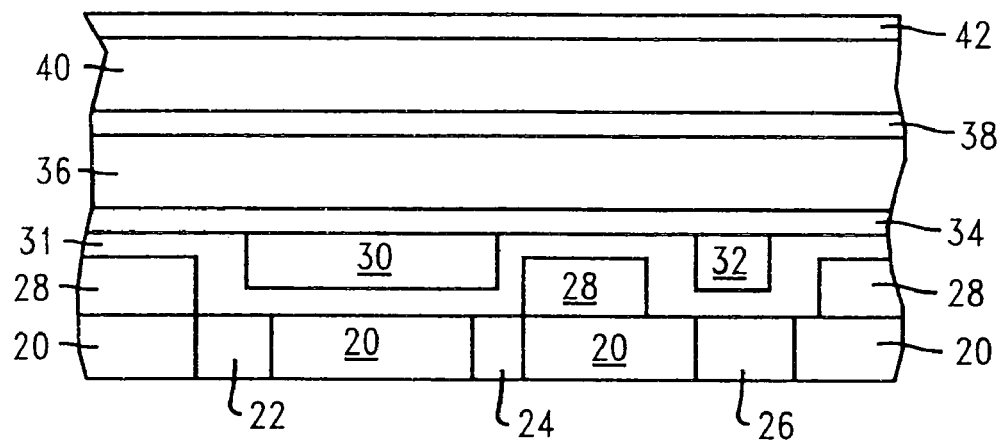
FIGS. 1-11 are cross-sectional, elevational views of the process steps employed to construct one embodiment of the air gap dielectric of the present invention in a semiconductor device.
Figure 2:
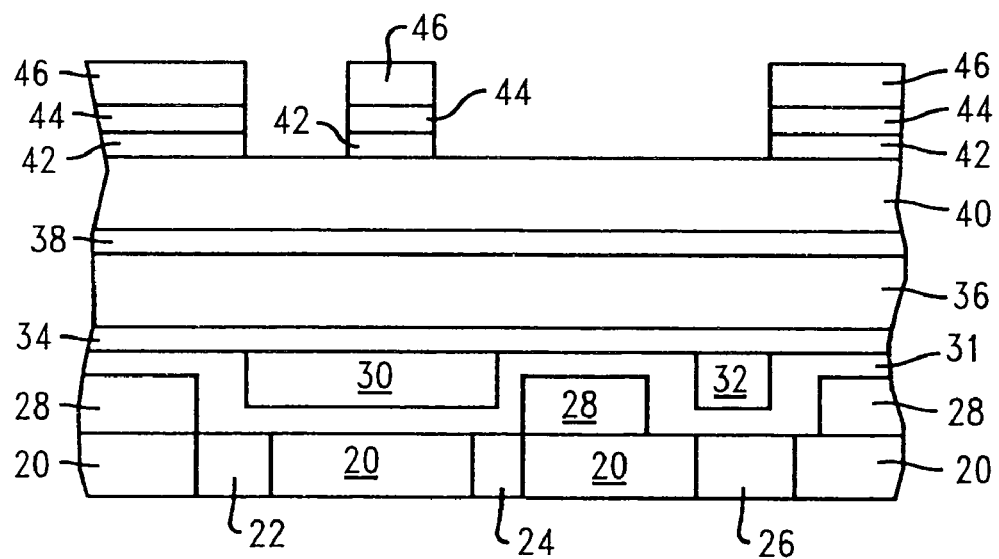
Figure 3:
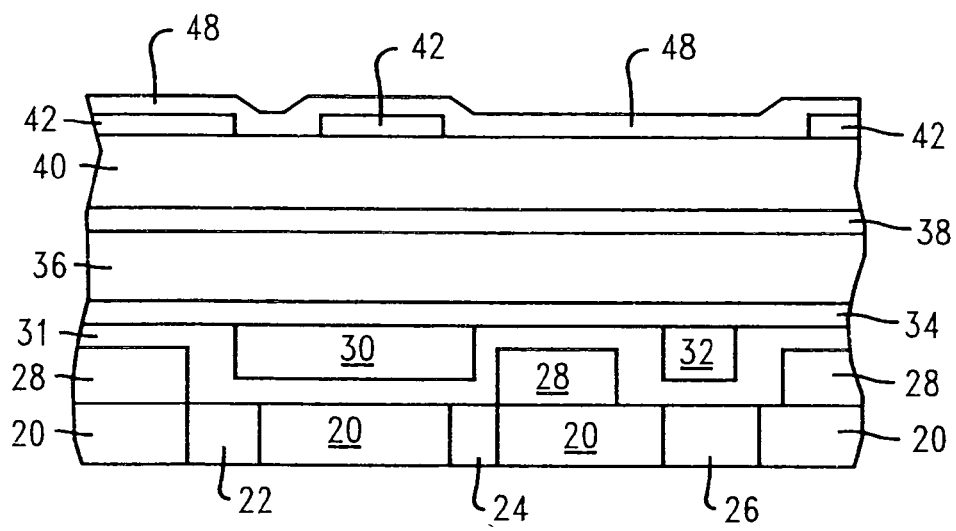
Figure 4:
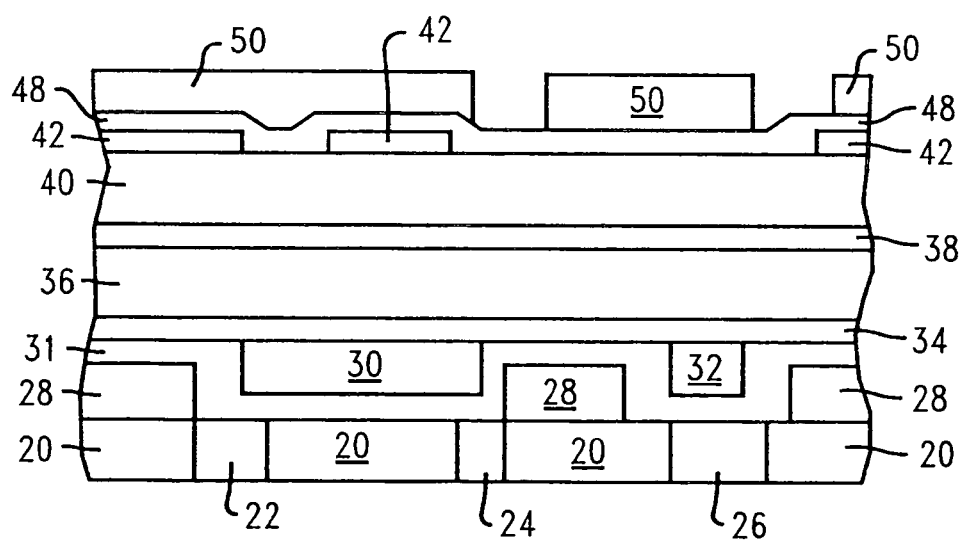
Figure 5:
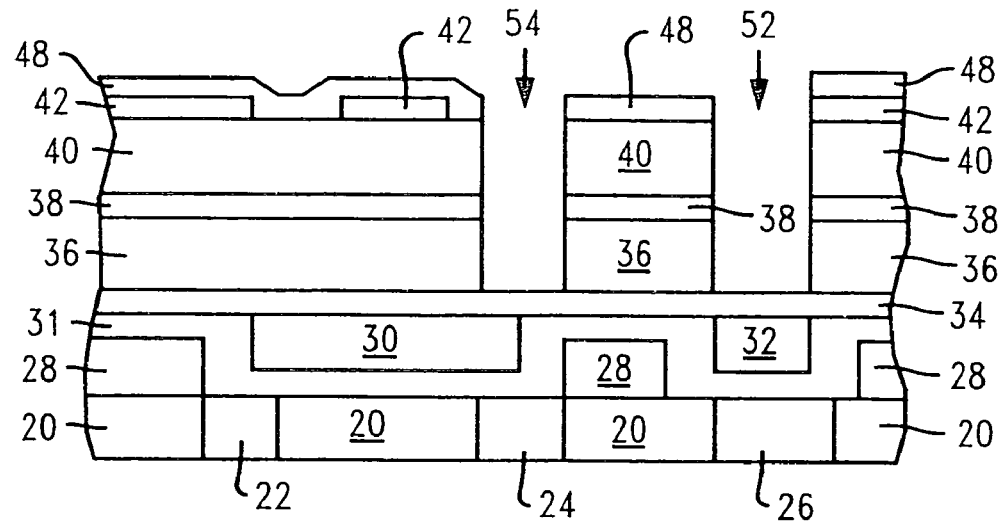

In describing the preferred embodiment of the present invention, reference will be made herein to FIGS. 1-12 of the drawings in which like numerals refer to like features of the invention. In a first embodiment, FIG. 1 depicts a dielectric stack deposited over a previously existing copper interconnect wiring level. The existing wiring level has a substrate dielectric layer 20 containing tungsten studs 22, 24, 26, over which is deposited dielectric layer 28 containing copper wires 30, 32 within TaN/Ta barrier layer 31. The dielectric layers may or may not be made of the same composition; for example, dielectric layer 20 may be phosphosilicate glass (PSG) while dielectric layer 28 may be undoped silicon glass (USG) or a glass containing silicon, carbon, oxygen and hydrogen (e.g., metholated $SiO_x$, SiCOH). The dielectric stack consists of, in order from the bottom, a cap layer 34, e.g., silicon nitride $Si_3N_4$, an insulator layer with good mechanical properties and thermal conductivity 36, e.g., USG or fluorinated silicon glass (FSG), an etch stop layer 38, e.g. SiC, a layer of a dielectric (low k) material with good mechanical properties and thermal conductivity 40, e.g., SiCOH, and a first hardmask layer 42, e.g., silicon carbide SiC. Etch stop layer 38 has a high etch rate ratio compared to underlying insulative layer 36, and insulative layer 40 has a high etch rate ratio compared to etch stop layer 38. An antireflective coating (ARC) layer 44 and resist layer 46 are then applied and, as shown in FIG. 2, are imaged for the trench pattern openings, and hardmask layer 42 is subsequently etched through the ARC and resist openings. Next, as shown in FIG. 3, a second hardmask layer 48, e.g., silicon dioxide $SiO_2$ or $Si_3N_4$, is deposited. A via resist layer 50 is thereafter applied and imaged to create via resist pattern openings, as shown in FIG. 4. The second hardmask layer 48 and the via openings 52, 54 are then etched through the pattern openings down to cap layer 34, and via resist 50 is then stripped, as shown in FIG. 5.

Figure 6:
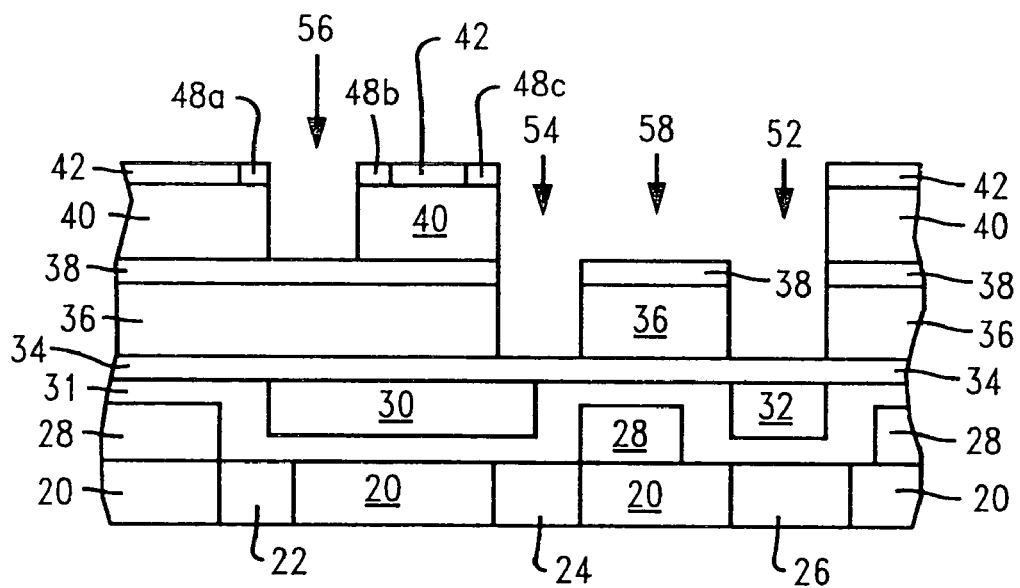

FIG. 6 depicts the blanket directional removal etch of second hardmask layer 48, only above the upper surface of first hardmask layer 42, which leaves second hardmask layer spacers 48a, 48b, 48c adjacent to all areas of first hardmask layer 42 edges except areas exposed by via photo, i.e., no spacer is formed on the sidewalls of via 52. As a result, spacers 48a and 48b are self-aligned and disposed adjacent trench/wire/via opening 56, and spacer 48c is adjacent via opening 54. The size of the spacers is determined by the thickness of each of the first and second hardmask layers. Trench 58, joining via openings 52 and 54, is then etched down to etch stop layer 38.

Figure 7:
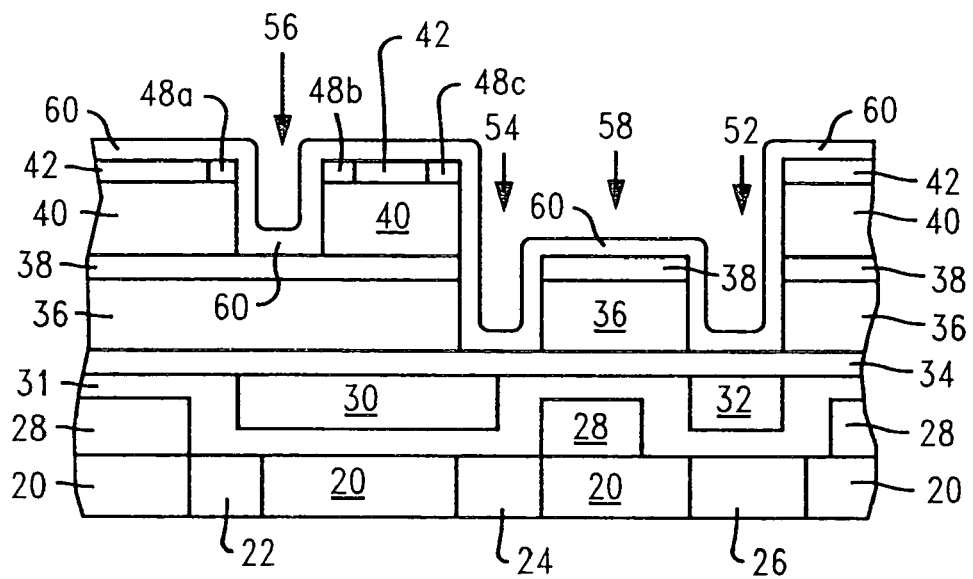
Figure 8:
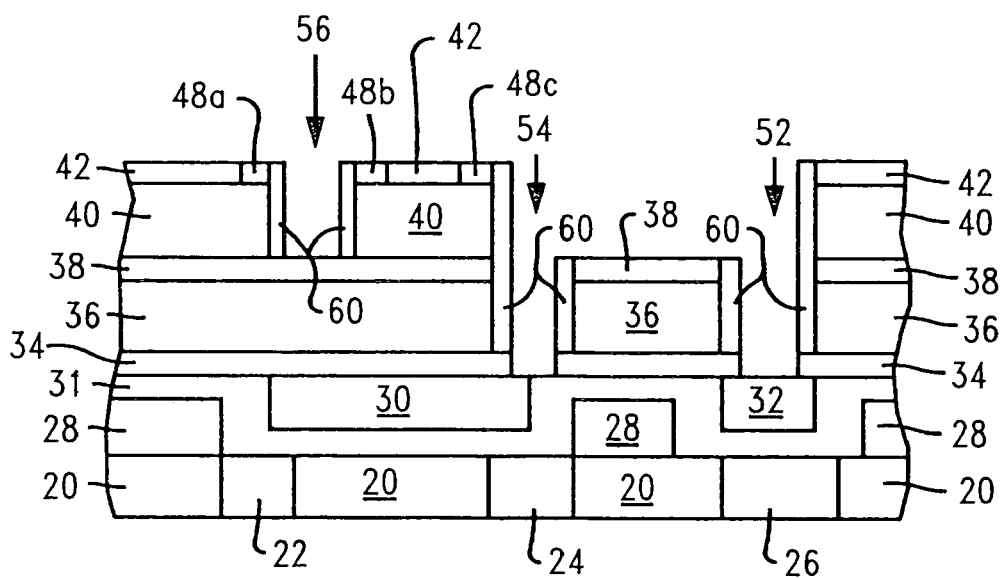

Next, a conformal deposition of a second insulator layer 60, e.g., $SiO_2$ or $Si_3N_4$, is applied over the exposed layers and into via openings 52, 54, and trenches 56, 58 of the existing structure, as shown in FIG. 7. Another etch is then performed for the blanket directional removal of portions of insulator layer 60 above hardmask layers 42, 48 and etch stop layer 38, and for the removal of the portions of insulator 60 at the bottom of via openings 52, 54, trench 56, as well as the portions of cap layer 34 below via openings 52 and 54. This leaves second spacers 60 lining via openings 52, 54 and trenches 56, 58. It should be noted that since these second spacers have reduced the size of trench openings 56, 58 and via openings 52, 54, when initially formed, the trench and via photo needs to be exposed and etched larger by about two times the spacer width.

Figure 9:
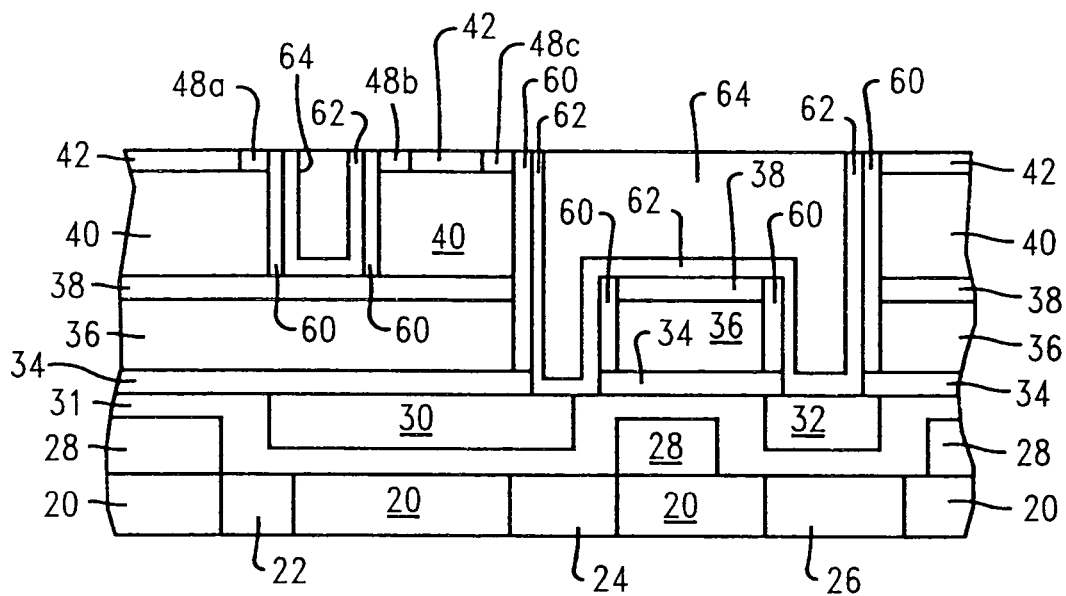
Figure 10:
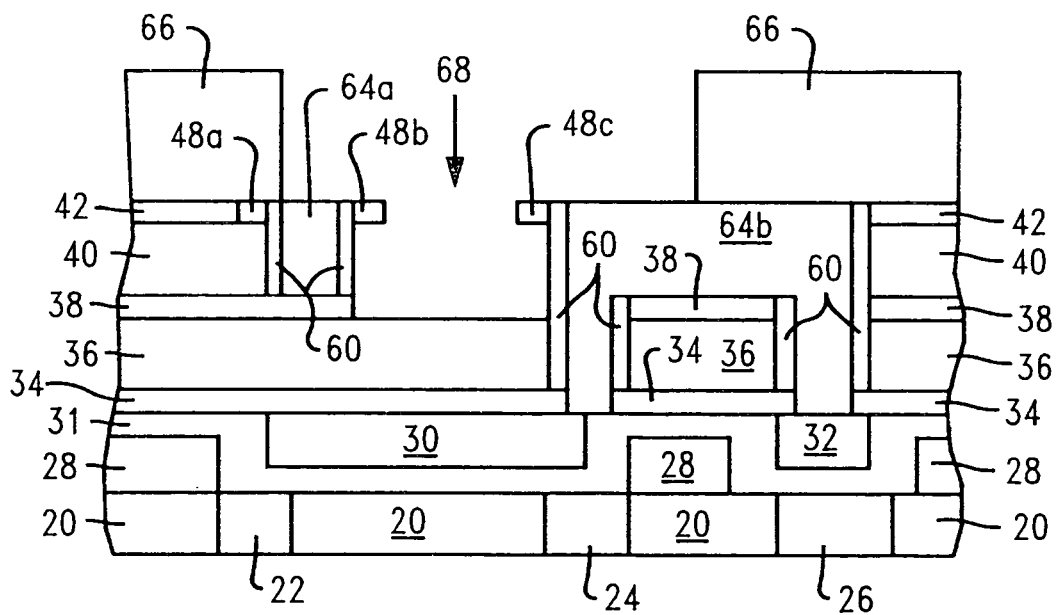
Figure 11:
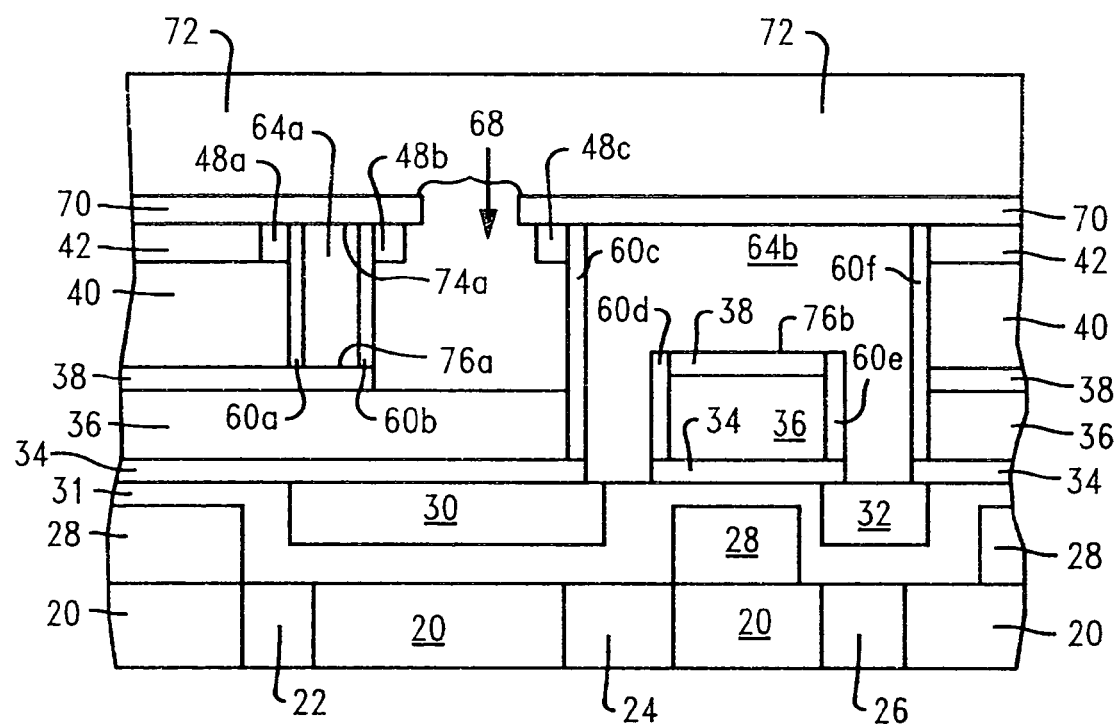

Conventional barrier-seed layer and copper deposition processes are used to fill the dual damascene structure, so that the trench and vias are first completely lined with a barrier (such as TaN/Ta) and seed layer 62, and then filled with copper 64, and then the excess material is removed by chemical mechanical polishing (CMP), as depicted in FIG. 9. In place of copper, other conductive materials such as aluminum, tungsten or gold may be employed. FIG. 10 shows resist block mask 66 used to expose only those areas that will receive the air gap dielectric. The SiC, SiCOH, SiC exposed portions of layers 42, 40 and 38 are degraded by exposure to oxygen plasma, oxygen reactive ion etch (RIE) or oxygen implantation followed by a dilute HF etch which, as shown, creates a space 68 with an overhang 48b, 48c between unmasked minimum space lines 64a, 64b, For example, supercritical $CO_2$ provides the carrier medium for dilute HF to remove the oxygen-degraded films. Isotropic deposition of insulative nitride cap layer 70, e.g., silicon nitride or silicon carbon nitride, and silicon dioxide or FSG insulative layer 72 are then applied, which close the air gap layer 68, without completely filling it, as shown in FIG. 11. Thus, air gap 68 extends completely through cap layer 70, and partially through insulative layer 72, above the interconnect level. Extraneous fill of air gap 68 can be reduced by minimizing the opening between overhang 48b and 48c, Alternatively a spin-on dielectric layer, chosen because of its surface tension properties, may also be applied to leave air gap 68 unfilled.

In the structure of the semiconductor device depicted in FIG. 11, interconnect wire 64a (filling former trench opening 56) is spaced from and adjacent to interconnect wire 64b (filling former trench 58 and via openings 52, 54) on the same interconnect level. Spacers 60b and 60c are formed along adjacent sides between wires 64a, 64b, and reduce the width of air gap 68, so that the actual air gap dielectric width is less than the printed distance spacing wires 64a, 64b, The air gap dielectric 68 formed between interconnects 64a, 64b also extends above upper surfaces 74a, 74b of the wires and below lower surfaces 76a, 76b of the wires. Air gap 68 as formed is self-aligned to the adjacent sides of the interconnect wires 64a, 64b.

Figure 12:
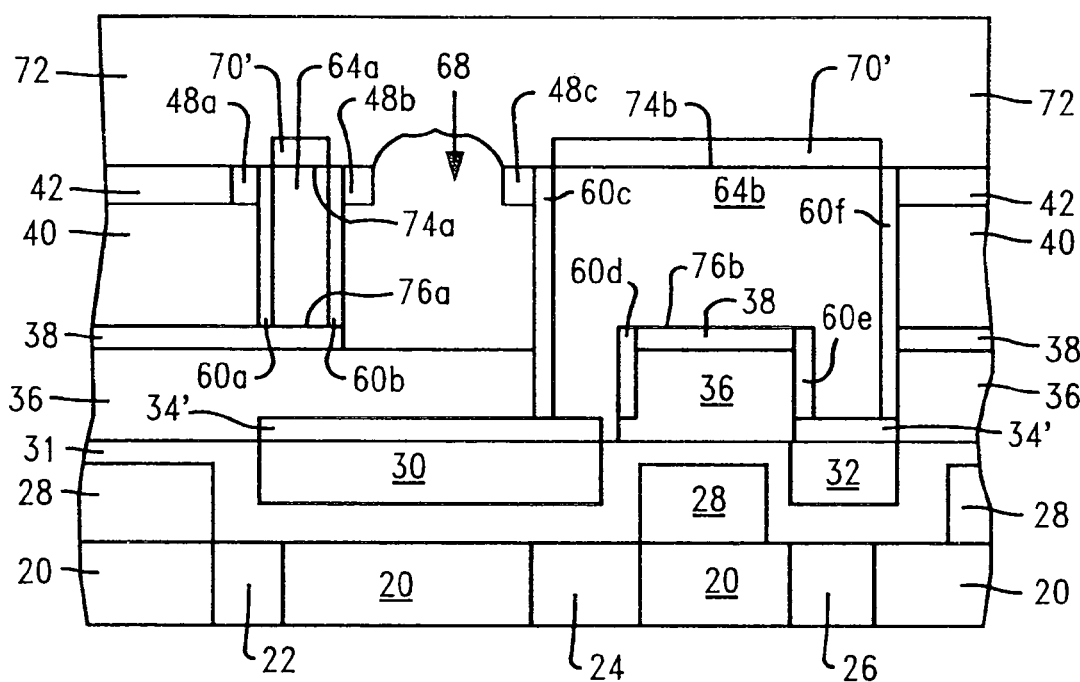
FIG. 12 is a cross-sectional, elevational view of an alternate embodiment of the final structure of the air gap dielectric of the present invention, wherein the lower cap layer is replaced by a self-aligned, selective metal deposition capping layer.

Another embodiment, shown in completion in FIG. 12, uses a similar process sequence as that described above, except that the silicon nitride $Si_3N_4$ cap layers 34 and 70 are replaced by self-aligned metal capping layers 34' and 70' over copper wires 30, 32, 64a, 64b, This may be applied by a selective metal deposition process, and the metal capping layer may comprise either selective tungsten or a selective cobalt tungsten phosphide layer. Where self-aligned metal capping layers 70' are employed, insulative layer 72 alone closes off the top of air gap 68.

Thus, the present invention provides a self aligned and adjustable air gap dielectric to reduce capacitance between adjacent, closely spaced conductive wires or vias. The height of the air gap above and below the adjacent copper line can be selected to cut off fringing capacitance and increase the effective electrical resistance (k) of the structure. The preferred via dielectric employed is an oxide such as USG or FSG with relatively good mechanical properties and thermal conductivity. A sacrificial trench dielectric and etch stop layer may be used to create the air gap, and these may be made of higher thermal conductivity and mechanical strength materials. A block mask may be used so that only areas on the chip with minimum spaces and a need for low capacitance receives the air gap. This maximizes the thermal conductance and mechanical stability of the chip. Since the trench and via are defined by an oxide or nitride spacer, problems associated with liner/barrier precursors entering a porous, low-k dielectric are eliminated, as are issues of barrier integrity causing Cu contamination of the dielectric and issues of sidewall roughness causing Cu resistivity increase.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

The invention claimed is:

1. A method for forming an air gap between a pair of interconnects on an interconnect level of a semiconductor device comprising:

depositing a plurality of insulative layers of a semiconductor device;

depositing a first hardmask insulative layer over the plurality of insulative layers;

removing portions of the first hardmask insulative layer to expose regions of the uppermost of the plurality of insulative layers over which interconnects are to be formed, the regions of over which interconnects are to be formed being spaced apart;

depositing a second hardmask insulative layer over the first hardmask layer and exposed regions of the uppermost of the plurality of insulative layers;

removing portions of the second hardmask insulative layer over the first hardmask insulative layer to expose regions of the uppermost of the plurality of insulative layers over which interconnects are to be formed, leaving second hardmask spacers adjacent to the regions of the uppermost of the plurality of insulative layers over which interconnects are to be formed;

using the first hardmask insulative layer and second hardmask spacers to etch the at least one of the underlying plurality of insulative layers to form interconnect openings;

depositing a conformal insulative layer to form spacers on sidewalls of the interconnect openings;

depositing conductive metal adjacent the conformal insulative layer spacers to form interconnects in the interconnect openings;

etching portions of the first hardmask insulative layer and underlying plurality of insulative layers between the interconnects and conformal insulative layer spacers, and leaving second hardmask spacers adjacent to the interconnects and conformal insulative layer spacers, to form an air gap extending below at least one of the interconnects;

depositing at least one insulative layer over the air gap and over the interconnects and conformal insulative layer spacers to seal the air gap.

2. The method of claim 1 wherein the air gap extends above the interconnects, into the at least one insulative layer.

3. The method of claim 1 wherein the step of depositing a plurality of insulative layers of a semiconductor device comprises depositing a first insulative capping layer of a semiconductor device; depositing a second insulative layer over the first insulative capping layer; depositing a third insulative layer etch stop layer over the second insulative layer; and depositing a fourth insulative layer over the third insulative etch stop layer; wherein removing portions of the first hardmask insulative layer exposes regions of the fourth insulative layer over which the interconnects are to be formed; and wherein there are etched portions of the first hardmask insulative layer, fourth insulative layer and third insulative etch stop layer between the interconnects and conformal insulative layer spacers, to leave the second hardmask spacers adjacent to the interconnects and conformal insulative layer spacers, and to form the air gap extending below at least one of the interconnects.

4. The method of claim 3 wherein the at least one insulative layer over the interconnects comprises a fifth insulative capping layer for the interconnect and a sixth insulative layer above the capping layer, and wherein the air gap extends completely through the fifth capping layer and into a portion of the sixth insulative layer.

* * * * *